(12) United States Patent
Blanchard

(10) Patent No.: US 7,067,376 B2
(45) Date of Patent: *Jun. 27, 2006

(54) HIGH VOLTAGE POWER MOSFET HAVING LOW ON-RESISTANCE

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/673,889

(22) Filed: Sep. 29, 2003

(65) Prior Publication Data

US 2004/0070044 A1    Apr. 15, 2004

Related U.S. Application Data

(60) Division of application No. 09/849,036, filed on May 4, 2001, now Pat. No. 6,627,949, which is a continuation-in-part of application No. 09/586,407, filed on Jun. 2, 2000, now Pat. No. 6,593,619.

(51) Int. Cl.
*H01L 21/336* (2006.01)

(52) U.S. Cl. .................. 438/268; 438/269; 257/341

(58) Field of Classification Search ........ 438/268–271, 438/589, 44, 245, 360, 388, 429, 14, 17, 438/138; 257/496, 491, 341, 331, 339, E29.26

See application file for complete search history.

(56) References Cited

U.S. PATENT DOCUMENTS 4,671,851 A * 6/1987 Beyer et al. ............... 438/426

(Continued)

FOREIGN PATENT DOCUMENTS

DE    197 48 523 A1    5/1999

(Continued)

OTHER PUBLICATIONS

G. Deboy et al. "A New Generation of High Voltage MOSFETS Breaks The Limit Line of Silicon," Electron Devices Meeting, San Francisco, California, Dec. 6-9, 1998, Paper No. 26.2.1, pp. 683-685, Sponsored by Electron Devices Society of IEEE.

(Continued)

*Primary Examiner*—Long Pham
*Assistant Examiner*—Thao X. Le
(74) *Attorney, Agent, or Firm*—Mayer & Williams PC; Stuart H. Mayer, Esq.; Karin L. Williams, Esq.

(57) ABSTRACT

A power MOSFET is provided that includes a substrate of a first conductivity type. An epitaxial layer also of the first conductivity type is deposited on the substrate. First and second body regions are located in the epitaxial layer and define a drift region between them. The body regions have a second conductivity type. First and second source regions of the first conductivity type are respectively located in the first and second body regions. A plurality of trenches are located below the body regions in the drift region of the epitaxial layer. The trenches, which extend toward the substrate from the first and second body regions, are filled with an epitaxially layered material that includes a dopant of the second conductivity type. The dopant is diffused from the trenches into portions of the epitaxial layer adjacent the trenches.

13 Claims, 7 Drawing Sheets

U.S. PATENT DOCUMENTS

| | | | |
|---|---|---|---|
| 4,758,531 A * | 7/1988 | Beyer et al. | 438/429 |
| 4,924,284 A * | 5/1990 | Beyer et al. | 257/621 |
| 4,959,699 A | 9/1990 | Lidow et al. | 357/23.7 |
| 5,216,275 A | 6/1993 | Chen | 257/493 |
| 5,250,461 A * | 10/1993 | Sparks | 438/429 |
| 5,404,040 A | 4/1995 | Hshieh et al. | 257/341 |
| 5,744,719 A | 4/1998 | Werner | 73/514.32 |
| 5,895,951 A | 4/1999 | So et al. | 257/330 |
| 5,973,360 A | 10/1999 | Tihanyi | 257/330 |
| 6,184,555 B1 | 2/2001 | Tihanyi et al. | 257/342 |
| 6,441,679 B1 * | 8/2002 | Ohshima | 327/538 |
| 6,452,230 B1 * | 9/2002 | Boden, Jr. | 257/341 |
| 6,468,853 B1 * | 10/2002 | Balasubramanian et al. | 438/221 |
| 6,479,352 B1 * | 11/2002 | Blanchard | 438/268 |
| 6,608,350 B1 * | 8/2003 | Kinzer et al. | 257/341 |
| 2002/0070418 A1 | 6/2002 | Kinzer et al. | 257/491 |

FOREIGN PATENT DOCUMENTS

| | | |
|---|---|---|
| DE | 198 00 647 C1 | 5/1999 |
| EP | 0 053 854 B1 | 5/1986 |
| EP | 0 973 203 A2 | 1/2000 |
| GB | 2 314 206 A | 12/1997 |
| JP | 08264772 | 11/1996 |
| WO | WO 99/23703 | 3/1999 |

OTHER PUBLICATIONS

T. Fujihira et al., "Simulated Superior Performances of Semiconductor Superjunction Devices," Proceedings of 1998 International Symposium on Power Semiconductor Devices & ICs, Kyoto, Japan, pp. 423-426.

Chen, Xingbi, "Theory of a Novel Voltage Sustaining (CB) Layer For Power Devices," *Chinese Journal of Electronics*, vol. 7, No. 3, Jul. 1998, pp. 211-216.

T. Fujihira, "Theory of Semiconductor Superjunction Devices," Japanese Journal of Applied Physics, vol. 36 (1997), pp. 6254-6262.

Jean-Marie Peter, "Power Semiconductors: New Devices Pursue Lower On-Resistance, Higher Voltage Operation," PCIM, Jan. 1999, pp. 26-32.

"Power Semiconductors Proliferate: Expanding Product Lines and Advancing Process Technology Promise Higher Performance in Varied Applications," Electronic Products, Jul. 1999, pp. 23-24.

L. Lorenz et al., "Improved MOSFET: An Important Milestone Toward A New Power MOSFET Generation," PCIM, Sep. 1998, pp. 14-22.

X. Chen, "Optimum Design Parameters For Different Patterns of CB-Structure," Chinese Journal of Electronics, vol. 9, No. 1, Jan. 2000, pp. 6-11.

Jack Glenn et al., "A Novel Vertical Deep Trench RESURF DMOS (VTR-DMOS)," Proceedings of the 12th International Symposium on Power Semiconductor Devices & ICS, Toulouse, France, May 22-25, 2000, pp. 197-200.

* cited by examiner

CONVENTIONAL MOSFET

THE SPECIFIC ON-RESISTANCE OF A VERTICAL DMOS TRANSISTOR WITH THE DOPANT DISTRIBUTION OF FIG. 1

THE DOPANT DISTRIBUTION OF A
HIGH VOLTAGE VERTICAL DMOS TRANSISTOR
WITH A RELATIVELY LOW ON-RESISTANCE

A DOPING PROFILE THAT WAS DIFFUSED FROM TRENCHES FILLED WITH DOPANT-RICH DIELECTRIC

A DOPING PROFILE THAT WAS DIFFUSED FROM A TRENCH CONTAINING DOPED POLYCRYSTALLINE SILICON AS WELL AS DEPOSITED DIELECTRIC

HIGH VOLTAGE POWER MOSFET HAVING LOW ON-RESISTANCE

RELATED APPLICATIONS

This application is a division of U.S. patent application Ser. No. 09/849,036 entitled "High Voltage Power MOSFET Having Low On-Resistance," filed on May 4, 2001, now U.S. Pat. No. 6,627,949 which is a continuation-in-part of U.S. application Ser. No. 09/586,407, entitled "High Voltage Power MOSFET Having Low On-Resistance," filed on Jun. 2, 2000 now U.S. Pat. No. 6,593,619.

FIELD OF THE INVENTION

The present invention relates generally to semiconductor devices, and more particularly to power MOSFET devices.

BACKGROUND OF THE INVENTION

Power MOSFET devices are employed in applications such as automobile electrical systems, power supplies, and power management applications. Such devices should sustain high voltage in the off-state and yield low voltage and high saturation current density in the on-state.

FIG. 1 illustrates a typical structure for an N-channel power MOSFET. An N-epitaxial silicon layer 1 formed over an N+ silicon substrate 2 contains p-body regions 5a and 6a, and N+ source regions 7 and 8 for two MOSFET cells in the device. P-body regions 5 and 6 may also include deep p-body regions 5b and 6b. A source-body electrode 12 extends across certain surface portions of epitaxial layer 1 to contact the source and body regions. The N-type drain for both cells is formed by the portion of N-epitaxial layer 1 extending to the upper semiconductor surface in FIG. 1. A drain electrode (not separately shown) is provided at the bottom of N+ substrate 2. An insulated gate electrode 18 comprising oxide and polysilicon layers lies over the channel and drain portions of the body.

The on-resistance of the conventional MOSFET shown in FIG. 1 is determined largely by the drift zone resistance in epitaxial layer 1. The drift zone resistance is in turn determined by the doping and the layer thickness of epitaxial layer 1. However, to increase the breakdown voltage of the device, the doping concentration of epitaxial layer 1 must be reduced while the layer thickness is increased. Curve 20 in FIG. 2 shows the on-resistance per unit area as a function of the breakdown voltage for a conventional MOSFET. Unfortunately, as curve 20 shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in paper No. 26.2 in the Proceedings of the IEDM, 1998, p. 683. This MOSFET is similar to the conventional MOSFET shown in FIG. 2 except that it includes p-type doped regions 40 and 42 which extend from beneath the body regions 5 and 6 into to the drift region of the device. The p-type doped regions 40 and 42 define columns in the drift region that are separated by n-type doped columns such as column, which are defined by the portions of the epitaxial layer 1 adjacent the p-doped regions 40 and 42. The alternating columns of opposite doping type cause the reverse voltage to be built up not only in the vertical direction, as in a conventional MOSFET, but in the horizontal direction as well. As a result, this device can achieve the same reverse voltage as in the conventional device with a reduced layer thickness of epitaxial layer 1 and with increased doping concentration in the drift zone. Curve 25 in FIG. 2 shows the on-resistance per unit area as a function of the breakdown voltage of the MOSFET shown in FIG. 3. Clearly, at higher operating voltages, the on-resistance of this device is substantially reduced relative to the device shown in FIG. 1, essentially increasing linearly with the breakdown voltage.

The improved operating characteristics of the device shown in FIG. 3 are based on charge compensation in the drift region of the transistor. That is, the doping in the drift region is substantially increased, e.g., by an order of magnitude or more, and the additional charge is counterbalanced by the addition of columns of opposite doping type. The blocking voltage of the transistor thus remains unaltered. The charge compensating columns do not contribute to the current conduction when the device is in its on state. These desirable properties of the transistor depend critically on the degree of charge compensation that is achieved between adjacent columns of opposite doping type. Unfortunately, nonuniformities in the dopant gradient of the columns can be difficult to avoid as a result of limitations in the control of process parameters during their fabrication. For example, diffusion across the interface between the columns and the substrate and the interface between the columns and the p-body region will give rise to changes in the dopant concentration of the portions of the columns near those interfaces.

The structure shown in FIG. 3 can be fabricated with a process sequence that includes multiple epitaxial deposition steps, each followed by the introduction of the appropriate dopant. Unfortunately, epitaxial deposition steps are expensive to perform and thus this structure is expensive to manufacture.

Accordingly, it would be desirable to provide a method of fabricating the MOSFET structure shown in FIG. 3 that requires a minimum number of deposition steps so that it can be produced less expensively while also allowing sufficient control of process parameters so that a high degree of charge compensation can be achieved in adjacent columns of opposite doping type in the drift region of the device.

SUMMARY OF THE INVENTION

In accordance with the present invention, a power MOSFET is provided that includes a substrate of a first conductivity type. An epitaxial layer also of the first conductivity type is deposited on the substrate. First and second body regions are located in the epitaxial layer and define a drift region between them. The body regions have a second conductivity type. First and second source regions of the first conductivity type are respectively located in the first and second body regions. A plurality of trenches are located below the body regions in the drift region of the epitaxial layer. The trenches, which extend toward the substrate from the first and second body regions, are filled with an epitaxially layered material that includes a dopant of the second conductivity type. The dopant is diffused from the trenches into portions of the epitaxial layer adjacent the trenches, thus forming the p-type doped regions that cause the reverse voltage to be built up in the horizontal direction as well as the vertical direction.

In accordance with one aspect of the invention, the material filling the trench is silicon.

In accordance with yet another aspect of the invention, the silicon filling the trench is at least partially oxidized.

In accordance with another aspect of the invention, the material filling the trench is a dielectric such as silicon dioxide, for example.

In accordance with another aspect of the invention, the material filling the trench may include both silicon and a dielectric.

In accordance with another aspect of the invention, a method is provided for forming a power MOSFET. The method begins by providing a substrate of a first conductivity type and depositing an epitaxial layer on the substrate. The epitaxial layer has a first conductivity type. First and second body regions are formed in the epitaxial layer to define a drift region therebetween. The body regions have a second conductivity type. First and second source regions of the first conductivity type are formed in the first and second body regions, respectively. A plurality of trenches are formed in the drift region of the epitaxial layer. A material having a dopant of the second conductivity type is epitaxially deposited in the trenches. The trenches extend toward the substrate from the first and second body regions. At least a portion of the dopant is diffused from the trenches into portions of the epitaxial layer adjacent the trenches.

DETAILED DESCRIPTION

Figure 1:
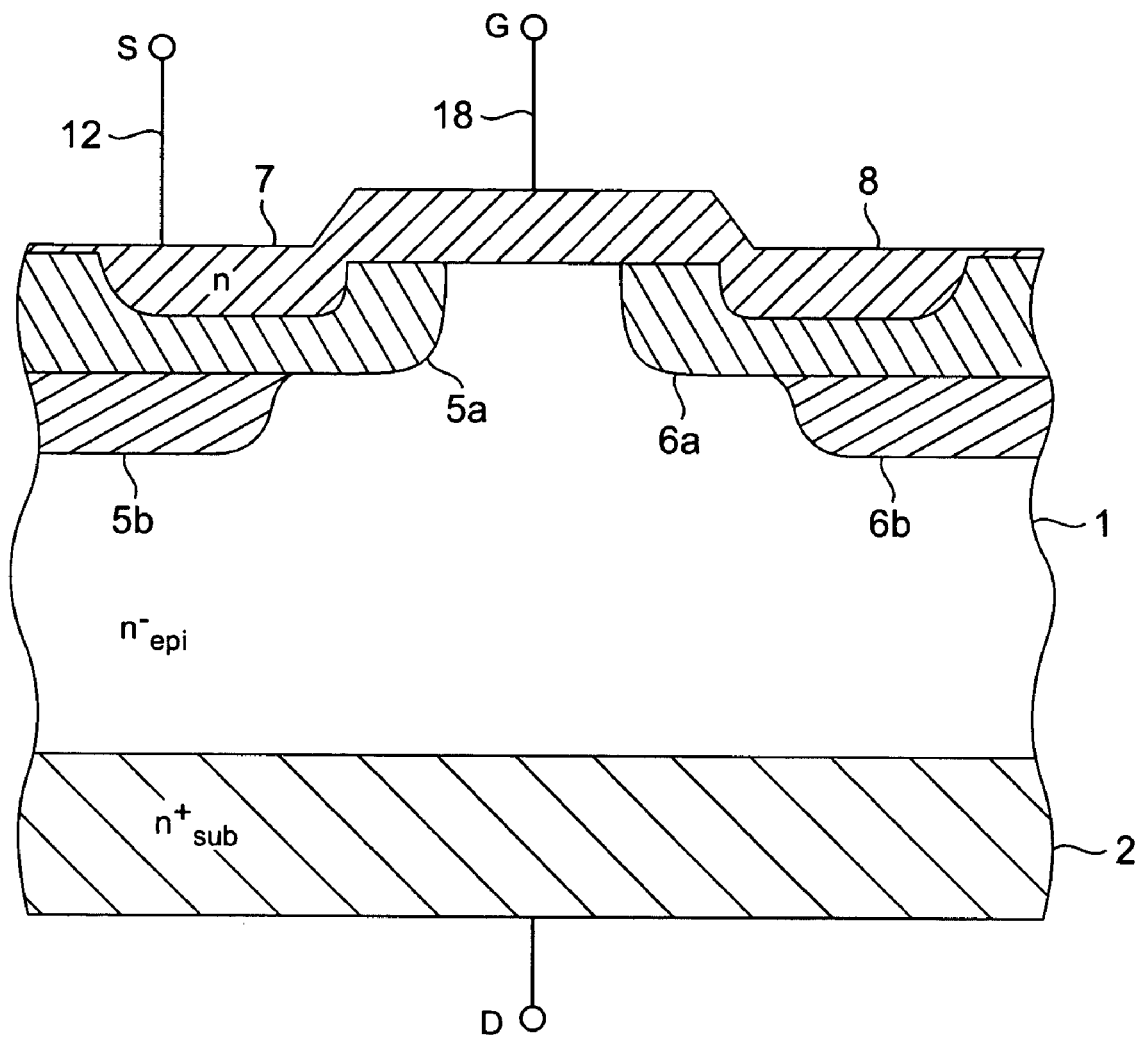
FIG. 1 shows a cross-sectional view of a conventional power MOSFET structure.
Figure 2:
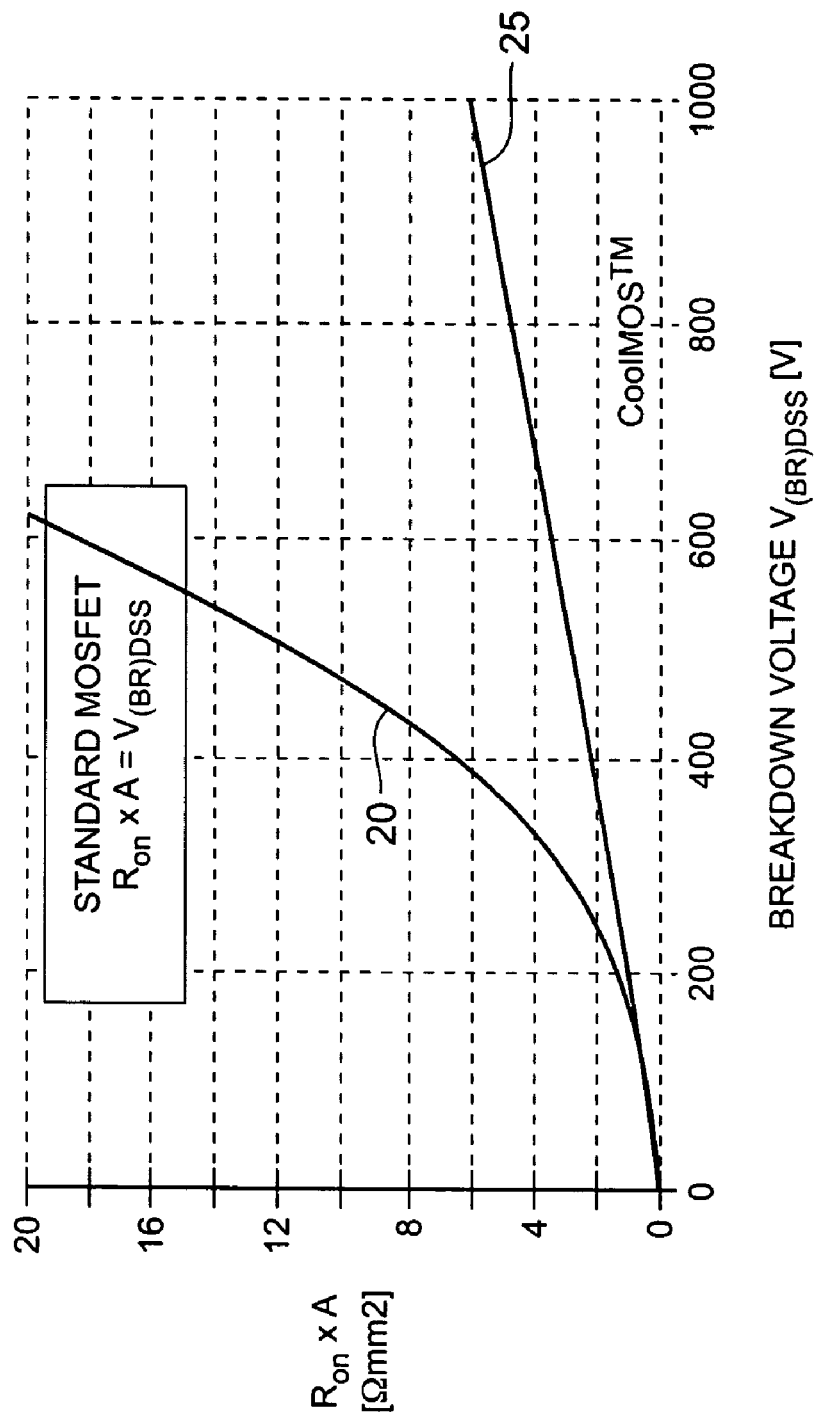
FIG. 2 shows the on-resistance per unit area as a function of the breakdown voltage for a conventional power MOSFET and a MOSFET constructed in accordance with the present invention.
Figure 3:
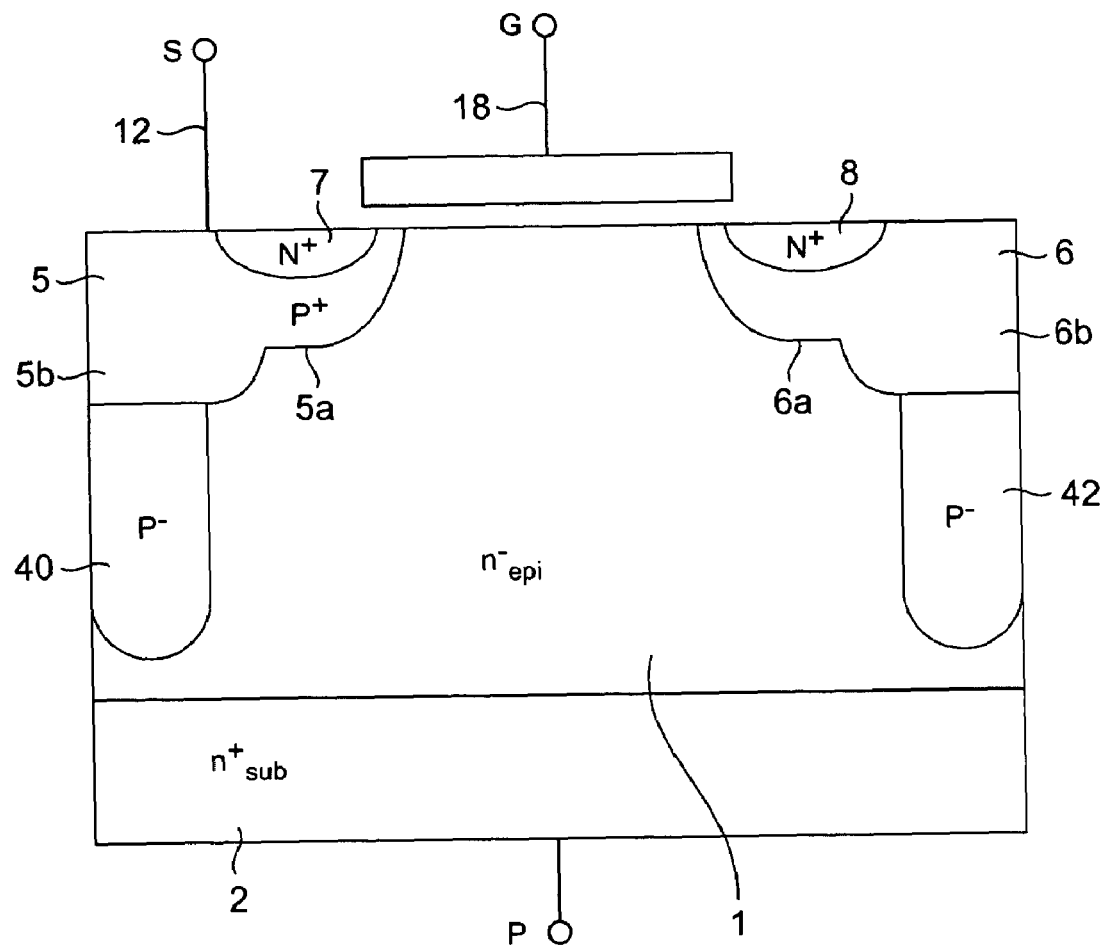
FIG. 3 shows a MOSFET structure designed to operate with a lower on-resistance per unit area at the same voltage than the structure depicted in FIG. 1.

In accordance with the present invention, the p-type regions 40 and 42 shown in FIG. 3 are formed by first etching a pair of trenches that are centered about the position where the p-type regions 40 and 42 are to be located. The trenches are subsequently filled with a dopant rich material. The dopant in the material is diffused out of the trenches and into the adjacent epitaxial layer that forms the drift region of the device. The resulting doped portions of the epitaxial layer form the p-type regions. The material filling the trenches, along with the dopant that has not been diffused out of the trenches, remain in final device. Accordingly, the material should be selected so that it does not adversely affect the characteristics of the device. Exemplary materials that may be used for the material filling the trenches include polysilicon or a dielectric such as silicon dioxide.

Figure 4:
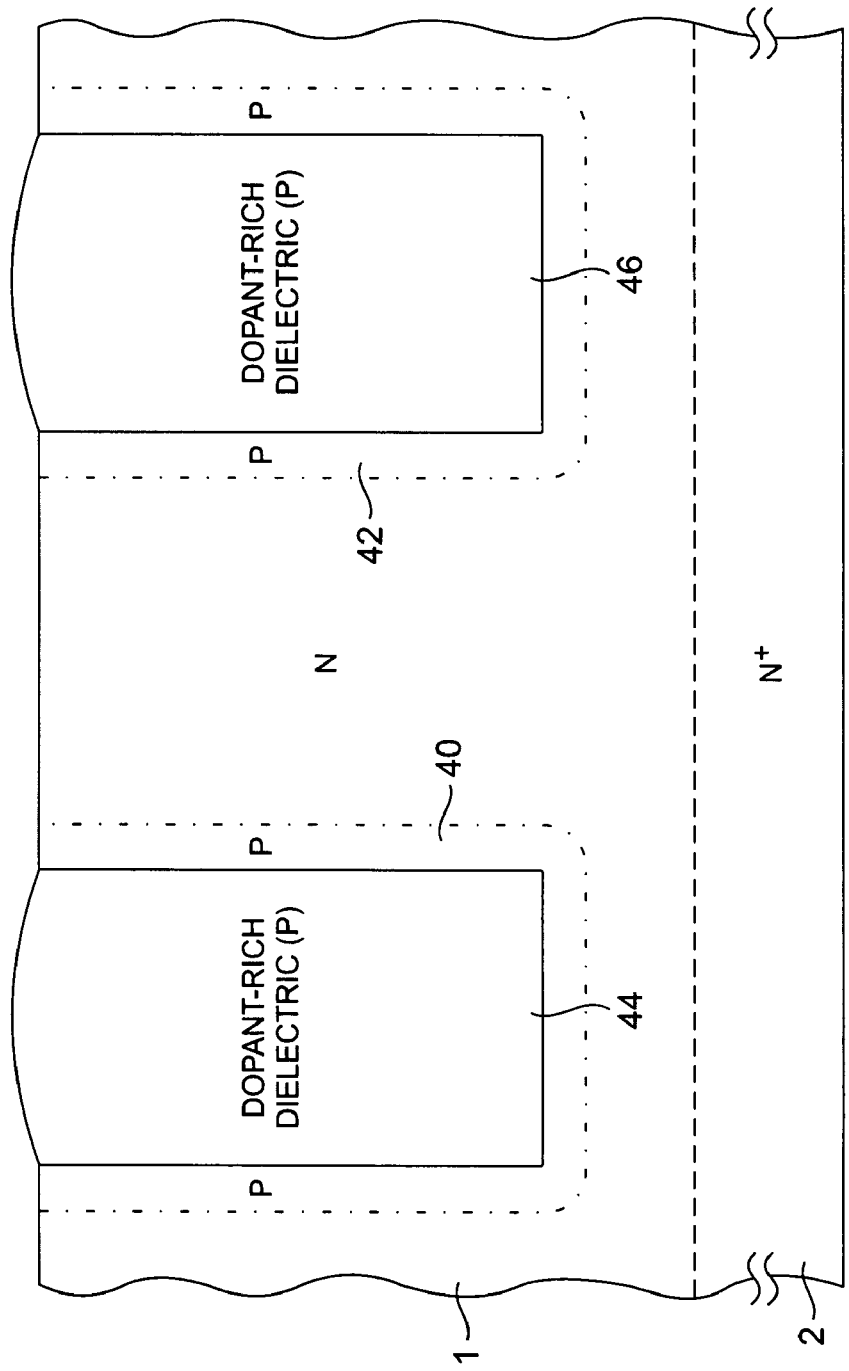
FIGS. 4–6 show the pertinent portions of various embodiments of the power MOSFET constructed in accordance with the present invention.
Figure 5:
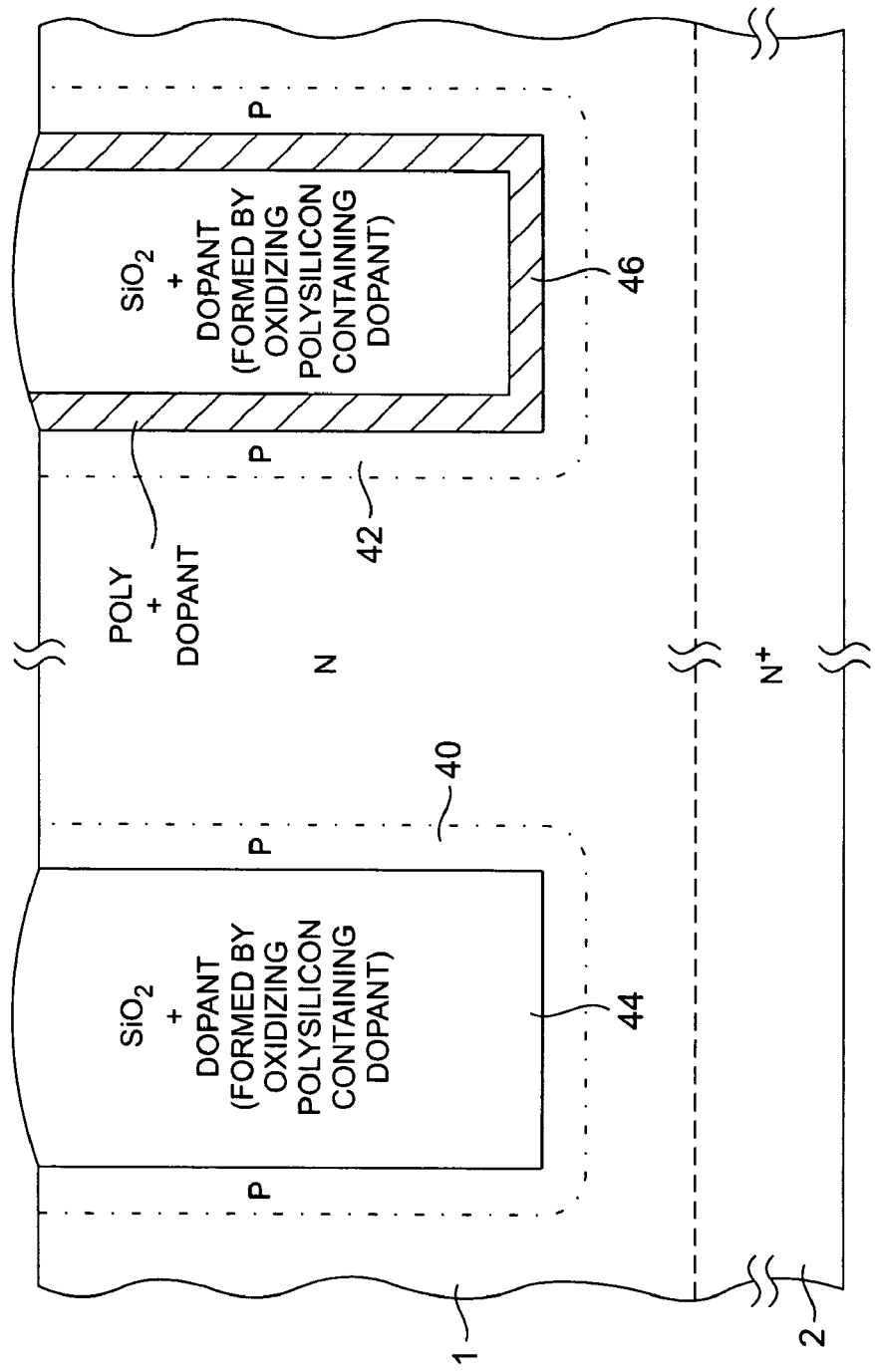
Figure 6:
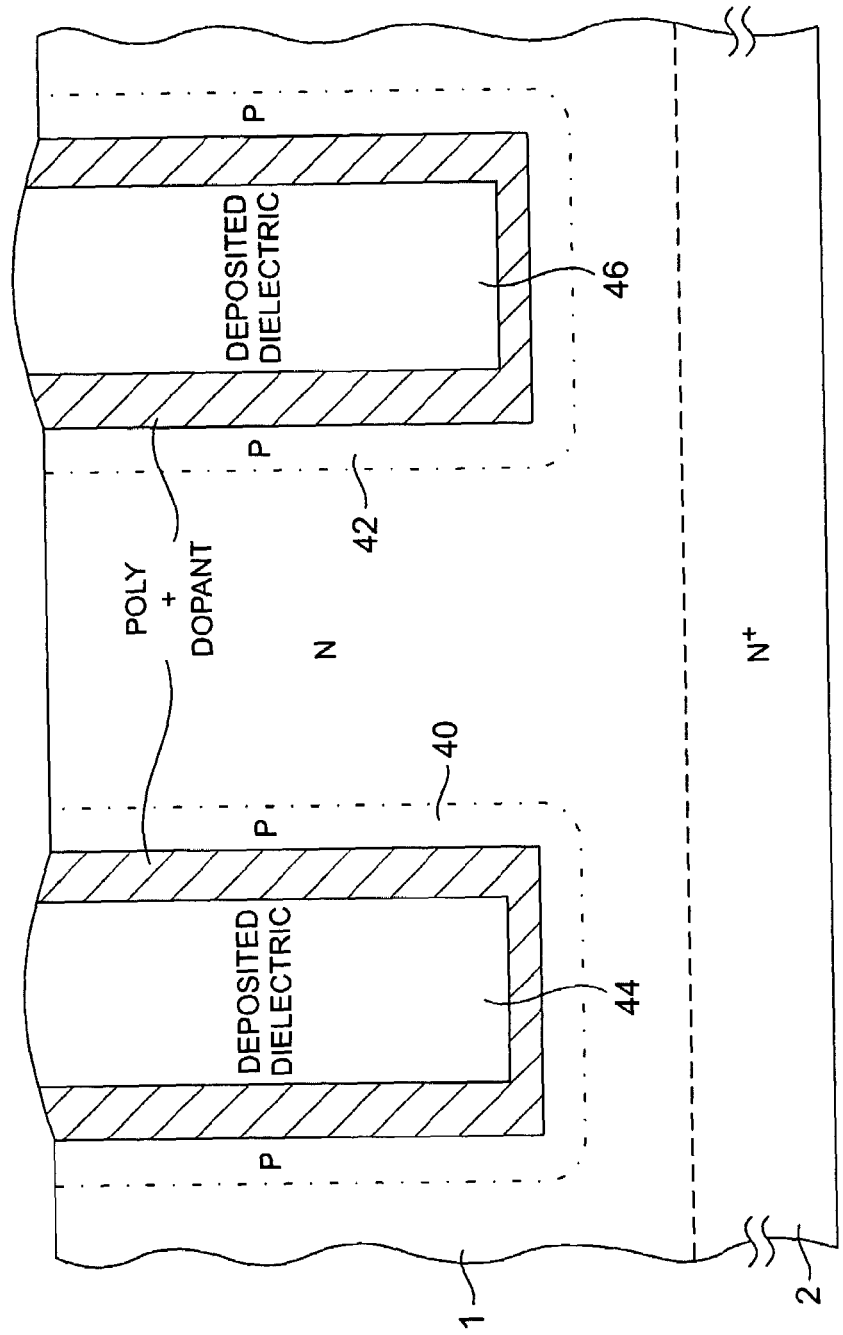

FIGS. 4–6 show several different combinations of materials that may be used to fill trenches 44 and 46 that are formed in epitaxial silicon layer 1. While FIGS. 4–6 show the trenches 44 and 46, epitaxial layer 1, and substrate 2, for purposes of clarity FIGS. 4–6 do not show the upper portion of the power MOSFET structure that includes the P-body regions and the sources.

In the embodiment of the invention shown in FIG. 4, the trenches 44 and 46 are filled with a doped dielectric such as boron-doped silicon dioxide. After the trenches are filled, the boron is diffused into the adjacent epitaxial layer 1 to form the p-type regions 40 and 42. The boron-doped silicon dioxide that fills the trench remains in the final MOSFET device.

In the embodiment of the invention shown in FIG. 5, the trenches are at least partially filled with polycrystalline silicon, i.e., polysilicon, that is doped with boron. After the trenches are filled, the boron is diffused into the adjacent epitaxial layer 1 to form the p-type regions 40 and 42. The remaining boron-doped polysilicon that fills the trench remains in the final MOSFET device. Alternatively, the polysilicon may be all or partially oxidized after the diffusion step is performed to form silicon dioxide. Accordingly, the trench remaining in the final MOSFET device is filled with a dielectric, i.e., silicon dioxide, and any residual polysilicon. In another alternative, any boron-doped polysilicon in the trench is recrystallized at an elevated temperature to form single crystal silicon. In this case the trench remaining in the final MOSFET device is filled with single crystal silicon, or single crystal silicon in combination with silicon dioxide or another dielectric.

In the embodiment of the invention shown in FIG. 6, the trenches 44 and 46 are first partially filled with doped polysilicon followed by the deposition of a dielectric to completely fill the trench. After the trenches are filled, the boron is diffused into the adjacent epitaxial layer 1 to form the p-type regions 40 and 42. The remaining boron-doped polysilicon and the dielectric filling the trench remains in the final MOSFET device. In some cases the boron-doped polysilicon is recrystallized at an elevated temperature to form single crystal silicon. Accordingly, the trench remaining in the final MOSFET device is filled with both single crystal silicon and a dielectric.

Figure 7:
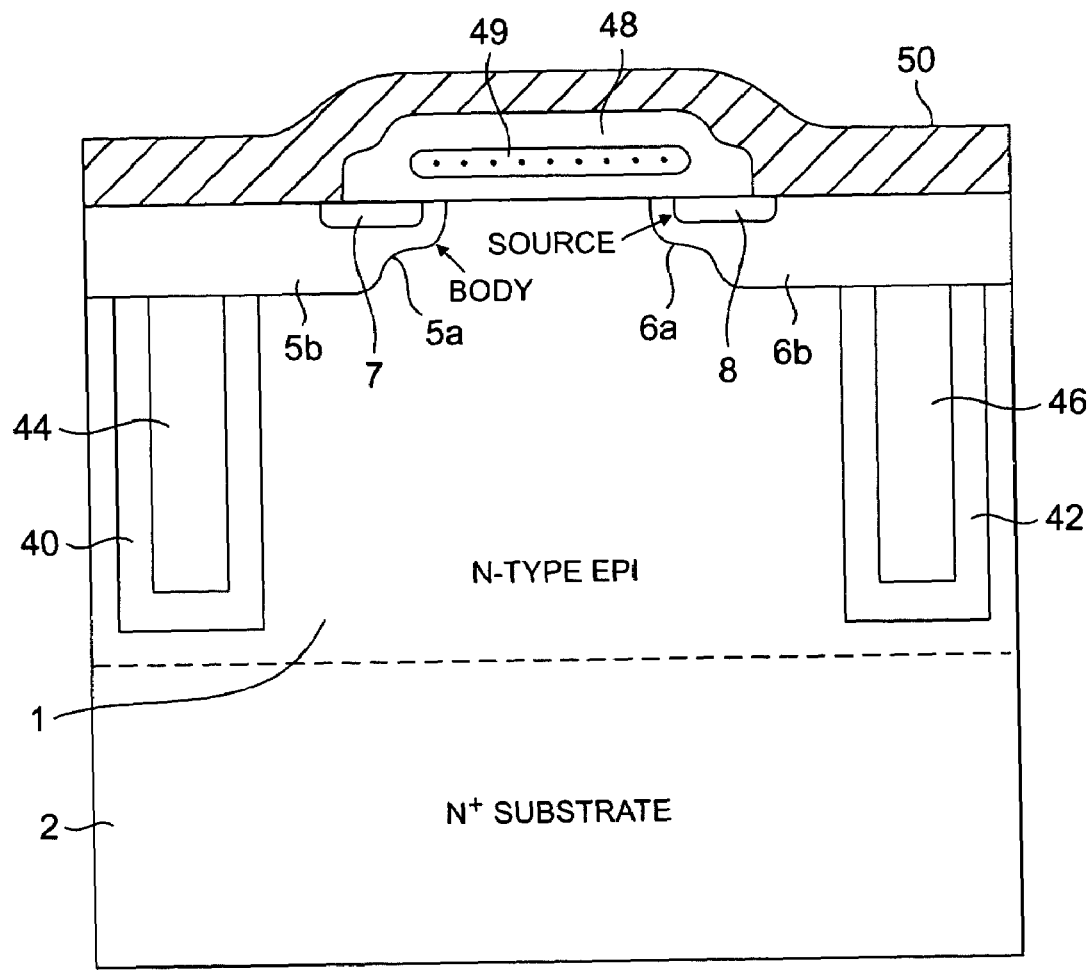
FIG. 7 shows a complete power MOSFET constructed in accordance with the present invention.

FIG. 7 shows the resulting power MOSFET constructed in accordance with the present invention. The MOSFET includes substrate 2, epitaxial layer 1, p-body regions 5a and 6a, deep p-body regions 5b and 6b, source regions 7 and 8, and p-type regions 40 and 42 in which trenches 44 and 46 are respectively located. P-type regions 40 and 42 define columns that are each separated by n-type doped columns. Also shown are the gate electrode, which includes oxide layer 48 and polysilicon layer 49, and the source-body electrode, which includes metallization layer 50.

In yet another embodiment of the invention, the trenches 44 and 46 may be filled with an epitaxially deposited material such as doped silicon. Epitaxial deposition may be advantageously employed in some cases because it both reduces defect formation and enhances the control of the dopant gradient in the trenches so that better uniformity can be achieved. As previously mentioned, control over the dopant gradient is important because the reduced on-resistance of the device at higher operating voltages depends critically on the degree of charge compensation that is achieved between adjacent columns of opposite doping type. Accordingly, while this embodiment of the invention does require the utilization of an additional epitaxial deposition step, it can advantageously allow better charge compensation to be achieved.

The additional control offered by filling the trench with an epitaxially deposited material can be used to compensate for dopant non-uniformities that can arise in the portions of the columns near the interfaces with the substrate and the p-body region. Such non-uniformities can be caused by the diffusion that inevitably arises between the different layers when dopant is diffused out of the trenches to form the columns. For example, in FIG. 7 when dopant is diffused from the trenches 44 and 46 to form the p-type regions 40 and 42, additional dopant from the heavily-doped p-body regions 5 and 6 also diffuses into p-type regions 40 and 42. Accordingly, the portions of p-type regions 40 and 42 near the p-body regions 5 and 6 will be more heavily doped than the remainder of p-type regions 40 and 42.

The aforementioned problem may be overcome by epitaxially depositing a material into the trench with a gradually decreasing dopant concentration. This can be accomplished using a "graded epi" technique. That is, during the epitaxial deposition, the dopant concentration can be gradually increased or decreased. In this way a single dopant source with a specified concentration of atoms can be used to produce a range of dopant levels. Alternatively, this could be accomplished by arranging two or more sources with silicon that are doped to different concentrations. During the latter stages of the epitaxial deposition process the source or sources with a lower dopant concentration could be primarily used to reduce the dopant concentration of the resulting layer in the trench near the p-body regions. When the subsequent diffusion step is performed to define the columns, additional dopant material from the p-body regions will diffuse into the p-type columns, compensating for the inherently lower dopant concentration in the epitaxially deposited layer. Of course, those of ordinary skill in the art will recognize that to obtain columns that are uniformly doped various process parameters such as the number of different sources, their dopant concentrations and the duration of the deposition steps from the different sources need to be optimized.

This same technique may be employed to compensate for the decreased dopant concentration that would otherwise arise in the portions of the p-type columns near the substrate. In this case, at the beginning of the epitaxial deposition process to fill the trenches, the source or sources with a higher dopant concentration could be primarily used to increase the dopant concentration of the resulting epitaxial layer located in the trench near the substrate.

The inventive power MOSFET shown in FIG. 7 may be fabricated in accordance with any conventional processing technique. For example, the following series of exemplary steps may be performed to form the power MOSFET depicted in FIG. 7.

First, an oxide masking layer is formed by covering the surface of epitaxial layer 1 with an oxide layer, which is then conventionally exposed and patterned to leave mask portions that define the location of the trenches 44 and 46. The trenches are dry etched through the mask openings by reactive ion etching to a depth that typically ranges from 10–40 microns. The sidewalls of each trench may be smoothed. First, a dry chemical etch may be used to remove a thin layer of oxide (typically about 500–1000 Å) from the trench sidewalls to eliminate damage caused by the reactive ion etching process. Next, a sacrificial silicon dioxide layer is grown over trenches 44 and 46 and the mask portions. The sacrificial layer and the mask portions are removed either by a buffer oxide etch or an HF etch so that the resulting trench sidewalls are as smooth as possible.

The trenches 44 and 46 are filled with any of the previously mentioned materials such as polysilicon, silicon dioxide, silicon, or a combination thereof. During deposition, the polysilicon or oxide are typically doped with a dopant such as boron. A subsequent diffusion step is performed to diffuse the dopant out the trenches and into the surrounding epitaxial layer. If the material remaining in the trenches is polysilicon, it may be oxidized or recrystallized.

Next, a photoresist masking process is used to form a patterned masking layer that defines source regions 7 and 8. Source regions 7 and 8 are then formed by an implantation and diffusion process. For example, the source regions may be implanted with arsenic at 80 KeV to a concentration that is typically in the range of $2\times10^{15}$ to $1.2\times10^{16}/cm^2$. After implantation, the arsenic is diffused to a depth of approximately 0.5 to 2.0 microns. The depth of the deep p-body region typically ranges from about 2.5 to 5 microns while the depth of the body region ranges from about 1–3 microns in depth. Finally, the masking layer is removed in a conventional manner to form the structure depicted in FIG. 7.

The DMOS transistor is completed in a conventional manner by forming and patterning the oxide layer to form contact openings. A metallization layer 50 is also deposited and masked to define the source-body and gate electrodes. Also, a pad mask is used to define pad contacts. Finally, a drain contact layer (not shown) is formed on the bottom surface of the substrate.

It should be noted that while in the previously described process the trenches are formed prior to the formation of the p-body and deep p-body regions, the present invention more generally encompasses processes in which the trenches are formed prior to, or subsequent to, any or all of the remaining doped regions. In addition, while a specific process sequence for fabricating the power MOSFET is disclosed, other process sequences may be used while remaining within the scope of this invention.

The power MOSFET device constructed in accordance with the present invention offers a number of advantages over the prior art device constructed by conventional techniques. For example, the vertical dopant gradient of the p-type regions is very nearly zero. The horizontal dopant gradient may be accurately controlled by varying the amount of dopant that is introduced and the number and duration of thermal cycles used in the diffusion step. Furthermore, the amount of dopant introduced and the lateral dopant gradient can be varied to optimize both the breakdown voltage and the on-resistance of the device.

In the embodiment of the invention shown in FIG. 7 the p-type trench is formed below the body region. However, not every p-type trench need have a body region associated with it, particularly at the perimeter of the die or in regions containing pads or interconnections.

Although various embodiments are specifically illustrated and described herein, it will be appreciated that modifications and variations of the present invention are covered by the above teachings and are within the purview of the appended claims without departing from the spirit and intended scope of the invention. For example, a power MOSFET in accordance with the present invention may be provided in which the conductivities of the various semiconductor regions are reversed from those described herein.

What is claimed is:

1. A method of forming a power MOSFET comprising the steps of:

providing a substrate of a first conductivity type;

depositing an epitaxial layer on the substrate, said epitaxial layer having a first conductivity type;

forming first and second body regions in the epitaxial layer to define a drift region therebetween, said body regions having a second conductivity type;

forming first and second source regions of the first conductivity type in the first and second body regions, respectively; and forming a plurality of trenches in said drift region of the epitaxial layer;

epitaxially depositing in said trenches a material having a dopant of the second conductivity type, said trenches extending toward the substrate from the first and second body regions; and diffusing at least a portion of said dopant from said trenches into portions of the epitaxial layer adjacent the trenches; said epitaxially deposited material filling the trench includes silicon; and further comprising the step of forming a layer of dielectric on the epitaxially deposited material filling the trench.

2. The method of claim 1 wherein said dopant is boron.

3. The method of claim 1 further comprising the step of forming a layer of thermal oxide on the epitaxial layer of silicon deposited in the trench.

4. The method of claim 1 wherein a layer of epitaxial silicon is deposited on the original trench walls and a layer of dielectric is formed on said epitaxial layer, thereby filling the trench.

5. The method of claim 1 wherein said body regions include deep body regions that are deeper than the first body region but shallower than p-type regions formed around the trenches.

6. The method of claim 1, wherein said trench is formed by providing a masking layer defining at least one trench, and etching the trench defined by the masking layer.

7. The method of claim 1, wherein said body region is formed by implanting and diffusing a dopant into the substrate.

8. The method of claim 1 wherein the epitaxially depositing step includes the step of epitaxially depositing a plurality of layers, at least two of said layers having different dopant concentrations.

9. The method of claim 8 wherein said plurality of layers includes an interface layer adjacent to one of the body regions, said interface layer having a lower dopant concentration than an interior layer of the epitaxially layered material.

10. The method of claim 1 wherein said epitaxially layered material has a dopant concentration that is reduced in the vicinity of the body regions relative to the dopant concentration profile in the vicinity of the substrate.

11. The method of claim 1 wherein said portions of the epitaxial layer adjacent the trenches have a substantially uniform dopant concentration in a direction lateral to the trenches, and have an opposite doping type to that of the epitaxial layers deposited on the substrate.

12. The method of claim 10 wherein said portions of the epitaxial layer adjacent the trenches have a substantially uniform dopant concentration in a direction lateral to the trenches, and have an opposite doping type to that of the epitaxial layers deposited on the substrate.

13. A power MOSFET made in accordance with the method of claim 1.

* * * * *

UNITED STATES PATENT AND TRADEMARK OFFICE
CERTIFICATE OF CORRECTION

PATENT NO. : 7,067,376 B2
APPLICATION NO. : 10/673889
DATED : June 27, 2006
INVENTOR(S) : Richard A. Blanchard It is certified that error appears in the above-identified patent and that said Letters Patent is hereby corrected as shown below:

Col. 1, Line 60, after "into", delete "to".

Col. 1, Line 63, after "columns", delete "such as column".

Col. 2, Line 37, after "perform", insert -- , --.

Col. 2, Line 37, after "thus", insert -- , --.

Col. 3, Line 59, after "trenches", change "remain" to -- remains --.

Col. 3, Line 59, before "final", insert -- the --.

Col. 4, Line 1, after "clarity", insert -- , --.

Col. 4, Line 24, after "case", insert -- , --.

Col. 5, Line 17, after "way", insert -- , --.

Col. 5, Line 22, after "process", insert -- , --.

Col. 5, Line 32, after "doped", insert -- , --.

Col. 5, Line 32, after "parameters", insert -- , --.

Col. 6, Line 2, after "out", insert -- of --.

UNITED STATES PATENT AND TRADEMARK OFFICE
CERTIFICATE OF CORRECTION

| | |
|---|---|
| PATENT NO. | : 7,067,376 B2 |
| APPLICATION NO. | : 10/673889 |
| DATED | : June 27, 2006 |
| INVENTOR(S) | : Richard A. Blanchard |

It is certified that error appears in the above-identified patent and that said Letters Patent is hereby corrected as shown below:

Col. 6, Line 25, after "process", insert -- , --.

Signed and Sealed this

Twenty-fourth Day of June, 2008

JON W. DUDAS
*Director of the United States Patent and Trademark Office*